United States Patent
Hsu et al.

(10) Patent No.: US 6,628,563 B1
(45) Date of Patent: Sep. 30, 2003

(54) FLASH MEMORY ARRAY FOR MULTIPLE SIMULTANEOUS OPERATIONS

(75) Inventors: Fu-Chang Hsu, San Jose, CA (US); Peter W. Lee, Saxatoga, CA (US); Hsing-Ya Tsao, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 10/191,228

(22) Filed: Jul. 9, 2002

Related U.S. Application Data (60) Provisional application No. 06/303,869, filed on Jul. 9, 2001.

(51) Int. Cl.[7] .............................................. G11C 8/00
(52) U.S. Cl. ............................. 365/230.03; 365/185.11; 365/185.13
(58) Field of Search ...................... 365/230.03, 185.11, 365/185.13, 63

(56) References Cited

U.S. PATENT DOCUMENTS

| | | | |
|---|---|---|---|
| 5,126,808 A | 6/1992 | Montalvo et al. ............. | 357/23.5 |
| 5,724,301 A | * 3/1998 | Seyyedy ................ | 365/230.03 |
| 5,748,538 A | 5/1998 | Lee et al. ............... | 365/185.06 |
| 5,847,998 A | 12/1998 | Van Buskirk .......... | 365/185.33 |
| 6,009,016 A | 12/1999 | Ishii et al. .............. | 365/185.24 |
| 6,072,722 A | 6/2000 | Hirano ................... | 365/185.13 |
| 6,088,264 A | 7/2000 | Hazen et al. ........... | 365/185.11 |
| 6,288,944 B1 | 9/2001 | Kawamura ............. | 365/185.22 |
| 6,301,153 B1 | 10/2001 | Takeuchi et al. ........ | 365/185.11 |
| 2002/0041510 A1 | * 4/2002 | Shimazaki et al. ........... | 365/63 |

* cited by examiner

*Primary Examiner*—Huan Hoang
(74) *Attorney, Agent, or Firm*—George O. Saile; Stephen B. Ackerman; Billy Knowles (57) ABSTRACT

A non-volatile integrated circuit memory having an AND-like array structure that is capable of simultaneous reading and writing of digital data to multiple memory cells within the integrated circuit memory has memory cells within an array block of memory cells are arranged in columns and rows. A plurality of block bit lines is in communication with each array block of memory cells such that each block bit line interconnects the memory cells of one column of memory cells within one array block. A plurality of word lines is in communication with each array block of memory cells such that each word line interconnects the memory cells of one row within one array block. The integrated circuit memory further includes a plurality of global bit lines in communication with the array blocks to select a column of the array blocks and to transfer the digital data from and to the array blocks. A bit line selector selectively connects the plurality of global bit lines to the block bit lines. An array controller controls selection of a row of a block of the array, control transfer of the digital data from selected global bit lines to selected block bit lines, control transfer of the digital data to other selected global bit lines from other selected bit lines to allow simultaneous transfer of the digital data from and to selected memory cells.

35 Claims, 5 Drawing Sheets

FLASH MEMORY ARRAY FOR MULTIPLE SIMULTANEOUS OPERATIONS

The instant application claims priority of U.S. Provisional Patent Application Ser. No. 06/303,869 files Jul. 9,2001, is herein incorporated by reference.

BACKGROUND OF THE INVENTION

1. Field of the Invention

This invention relates to integrated circuit memory devices. More particularly this invention relates to circuits and devices for simultaneous storing and/or retrieving of digital data to and from integrated circuit memory. Even more particularly, this invention relates to simultaneous reading and programming of non-volatile integrated circuit memory or flash memory.

2. Description of Related Art

Non-volatile memories, especially Flash memories, have been widely used in various electronic applications such as computers, hand-held computing and control devices, communication devices, and consumer products. Due to its characteristic of non-volatility and on-system re-programmability, the flash memories are suitable to store both the program code and data code for a system. However, flash memory has its own disadvantage. Compared with volatile memories such as dynamic random access-memories and static random access memories, flash memories require a relative long period of time in processing a program/erase or 'write' operation. It typically takes several microseconds to seconds to write the data. During this time period, the whole memory is occupied and no other memory operations such as a read may be performed. Therefore, a 'simultaneous read and write operation' is highly demanded for flash memory.

An example of a simultaneous read and write operation for a flash memory is shown in U.S. Pat. No. 6,088,264 (Hazen et al.). The memory array contains more than two individual arrays and each array can independently perform read or write operations. Therefore, the data stored in one array can be read while the other array is doing the write operation. Each array of Hazen et al. requires additional decoder circuits, data buses, and control circuits to perform the simultaneous read and write operation. The extra area consumed, thus, limits the number of the arrays being used. Because the number of arrays is limited, each array is generally denser. This diminishes the amount of data that can be simultaneously read and/or written. When one array is being programmed or written to, the whole is array is unavailable being read.

U.S. Pat. No. 5,847,998 (Van Buskirk), disclosed another approach to enable arrays having a much smaller size for simultaneous read and write operation. It directly divided the array into several small-size blocks, such as 512 kb per block, and enables each block to be simultaneously read or programmed. Unfortunately, this approach can be only used for a flash memory having a 'NOR' structured array only. It cannot be used for any other flash memory array structures such as flash memories having an 'AND' array structure, because the cell operation and the bias conditions for the NOR array and the AND array are different.

It is well known in the art that flash memories have different array structures, and each array structure has its own features and characteristics. These array structures can be basically fallen into two categories, the 'NOR-type' array, as illustrated in U.S. Pat. No. 6,301,153 (Takeuchi et al.) and the 'NAND-type' array, as illustrated in U.S. Pat. No. 6,288,944 (Kawamura). For the NOR-type array, the memory cells are connected to bit lines in parallel. The NAND-type array, on the other hand, connects the memory cells serially. Due to this major difference, the NOR-type array tends to provide faster read speed and thus the NOR-type array dominates the high-speed application market. The NAND-type array tends to have smaller cell size. Due to its serial structure, the NAND-type, thus, dominates the low-cost, slow-speed, higher-density market.

The conventional NOR-type array includes several different structures as illustrated in Takeuchi et al. Takeuchi et al. illustrates the NOR, AND, and DINOR array structures. Other known structures include the Dual-String NOR and the OR. Each structure is an optimum solution for its own technology, and its own read, erase and program conditions and algorithm. The structures are further categorized according to the programming mechanism used. Only the NOR array and some Dual-String NOR arrays use Channel-Hot-Electron (CHE) injection in programming. All others use Fowler-Nordheim (FN) tunneling in programming. For this invention the NOR-type flash memory arrays that use Channel-Hot-Electron programming are termed 'NOR-like' arrays. The NOR-type arrays that use Fowler-Nordheim tunneling for programming are termed 'AND-like' array.

Figure 1:
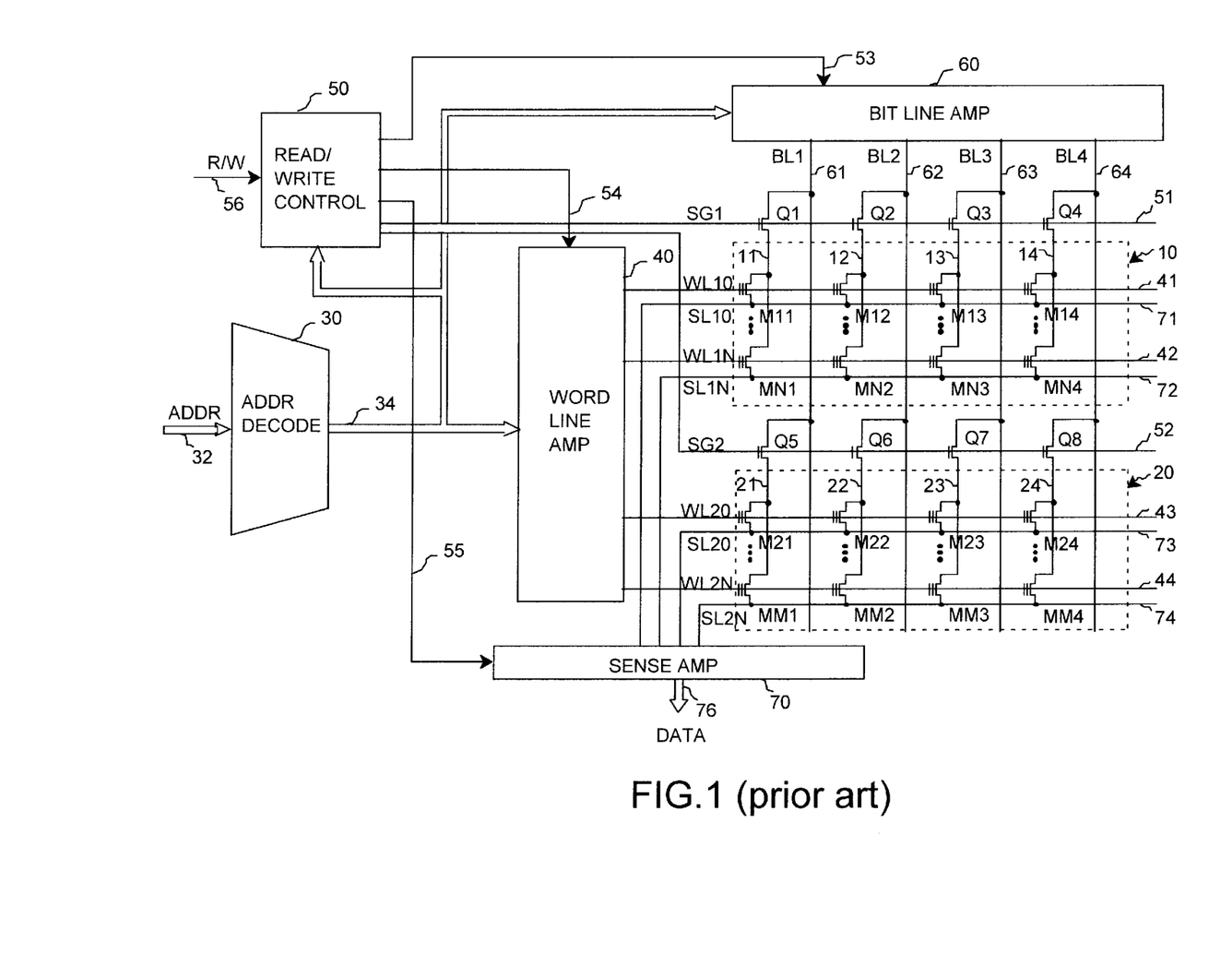
FIG. 1 is a schematic diagram of a NOR-like flash memory array of the prior art.

The conventional NOR-like array and the AND-like array structures of the prior art are not suitable for the simultaneous read and write (program/erase) operation. The simultaneous read and write operation is not possible because the array structures NOR-like array and the AND-like array cannot allow multiple blocks from being accessed, one for read and one for programming, at the same time. For example, FIG. 1 illustrates a conventional NOR array as an example of the NOR-like arrays.

The NOR structured flash memory is divided into multiple blocks 10 and 20. Each block 10 and 20 consists of memory cells M11, . . . , MN4, and M21, . . . , MM4. The control gates of each row of the memory cells M11, . . . , MN4, and M21, . . . , MM4 are connected together and to the word lines 41, 42, 43, and 44. The word lines 41, 42, 43, and 44 are connected to word line amplifier 40 to receive the word line control signals to cause selected rows of the memory cells M11, . . . , MN4, and M21, . . . , MM4 to be either read or written (programmed/erased).

Each column of the memory cells M1, . . . , MN4, and M21, . . . , MM4 of each array block 10 and 20 are interconnected by sub-bit lines or local bit lines 11, 12, 13, and 14 for array block 10 and local bit lines 21, 22, 23, and 24 for array block 20. The local bit lines 11, 12, 13, and 14 for array block 10 are connected respectively to the sources of the switch transistors Q1, Q2, Q3, and Q4. The drains of the switch transistors Q1, Q2, Q3, and Q4 are connected respectively to the global bit lines 61, 62, 63, and 64. The local bit lines 21, 22, 23, and 24 for array block 20 are connected respectively to the sources of the switch transistors Q5, Q6, Q7, and Q8. The drains of the switch transistors Q5, Q6, Q7, and Q8 are connected respectively to the global bit lines 61, 62, 63, and 64.

The global bit lines 61, 62, 63, and 64 are connected to the bit line amplifier 60 to receive the bit line control signals to cause the memory cells M11, . . . , MN4, and M21, . . . , MM4 to be either read or written (programmed/erased).

The encoded address signals 30 are received and decoded by the address decoder 30. The decoded address signals 34 are transferred to the word line amplifier 30 and the bit line amplifier 60. The decoded address signals provide the word line and bit line control signals to activate the desired memory cells M11, ..., MN4, and M21, ..., MM4 to be either read or written (programmed/erased). The read/write signal 56 and other timing and control signals (not shown) are received by the read/write control circuit 50 to provide the necessary timing and control signals 53 and 54 to the bit line amplifier 60 and the word line amplifier 40.

The gate select lines 51 and 52 are provided by the read/write control circuit 50 to activate the desired switch transistors Q1, Q2, Q3, and Q4 or the desired switch transistors Q5, Q6, Q7, and Q8. The selected switch transistors Q1, Q2, Q3, and Q4 or switch transistors Q5, Q6, Q7, and Q8 connect the local bit lines 11, 12, 13, and 14 for the array block 10 or the local bit lines 21, 22, 23, and 24 for array block 20 to the global bit lines 61, 62, 63, and 64.

The sources of each memory cell of each row of the memory cells M11, ..., MN4, and M21, ..., MM4 are connected together and to the source lines 71, 72, 73, and 74. The source lines 71, 72, 73, and 74 are connected to the sense amplifier 70 to detected the digital data read from the memory cells of a selected row of the memory cells M11, ..., MN4, and M21, ..., MM4. The control signal line 55 provides the necessary timing and activation signals to appropriately generate the digital data at the output 76 of the source line amplifier 76.

Figure 2:
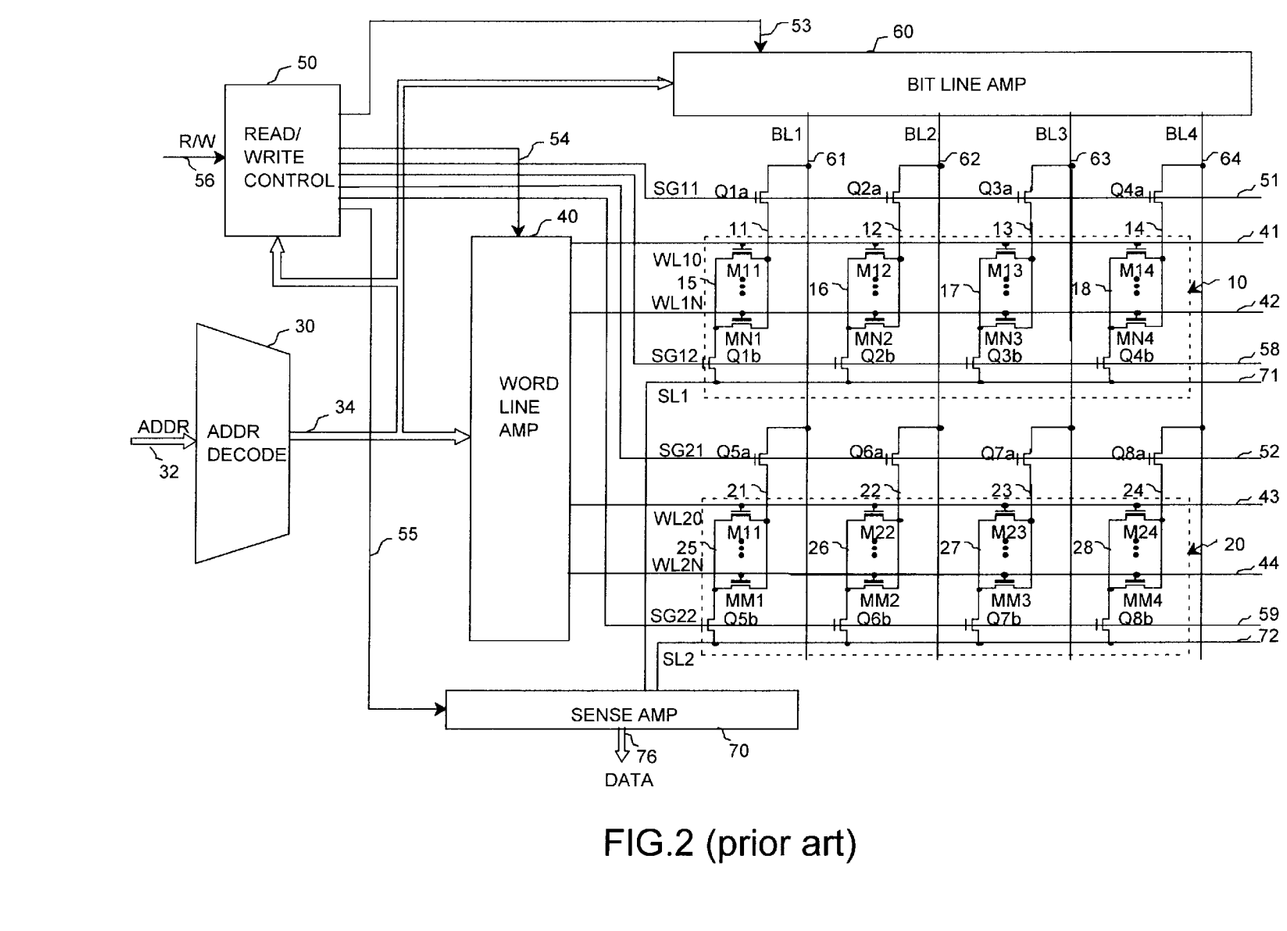
FIG. 2 is a schematic diagram of an AND-like flash memory array of the prior art.
Figure 3:
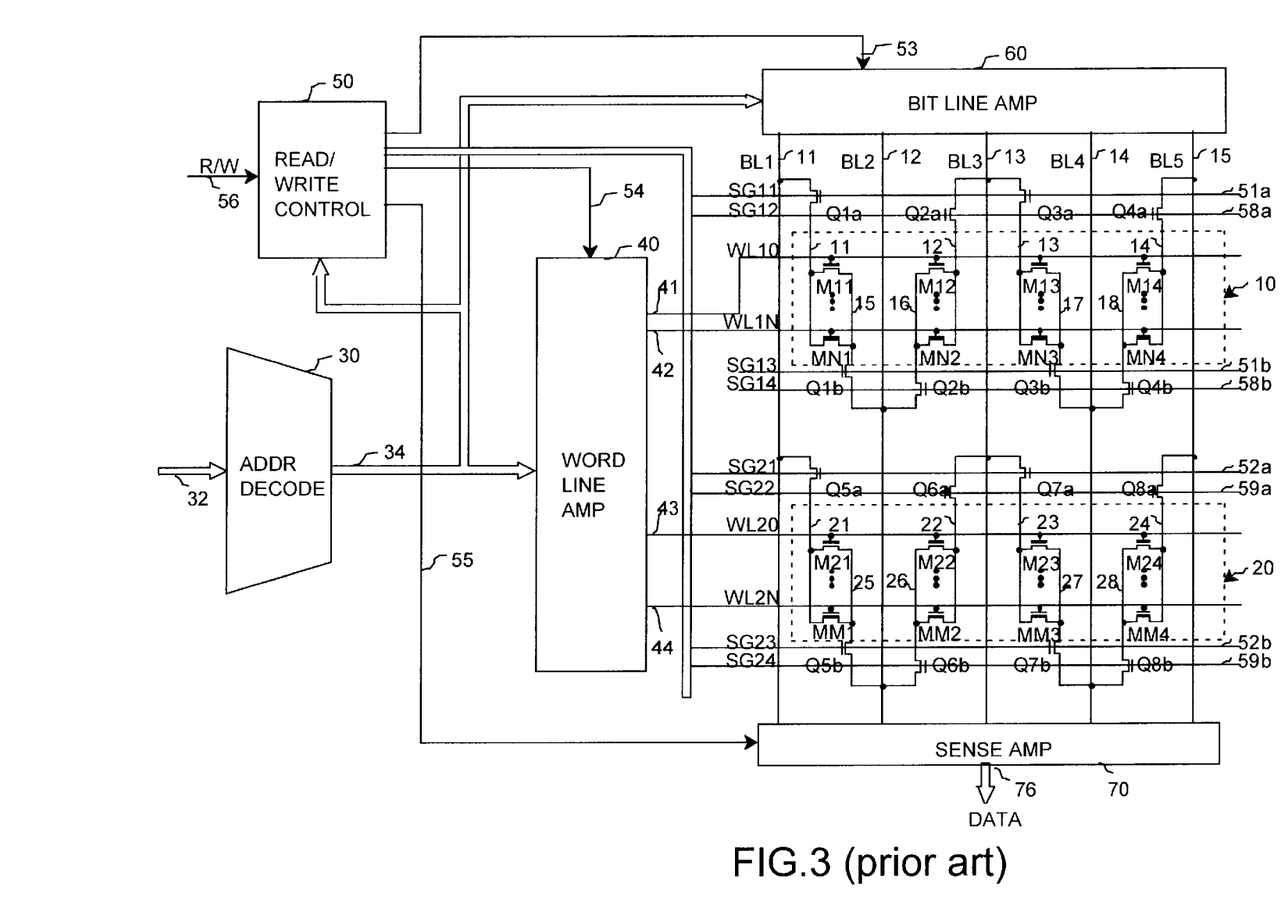
FIG. 3 is a schematic diagram of a simultaneous read and write NOR-like flash memory array of prior art.

The NOR flash memory array, as shown, is not suitable for a simultaneous read and write operation, because of the array structure. When the array block 10 is selected, the select transistors (Q1–Q4) are all turned on by the control signal present at the gate select line 51, and all the global bit lines 61, 62, 63, and 64 are connected to the local bit lines 11, 12, 13, and 14. The local bit lines 21, 22, 23, and 24 of the second array block 20 will not be able to be read from or written to through the global bit lines 61, 62, 63, and 64, because all the global bit lines 61, 62, 63, and 64 are already connected to the local bit lines 11, 12, 13, and 14 of the first array block 10.

second example, as shown in FIG. 2 illustrates a conventional AND array as an example of the AND-like array. The structure of the AND array is similar to the NOR array of FIG. 1 except there is a second set of local bit lines 15, 16, 17, and 18 for the first array block 10 and a second set of local bit lines 25, 26, 27, and 28 for the first array block 20. The second set of local bit lines 15, 16, 17, and 18 of the first array block 10 and a second set of local bit lines 25, 26, 27, and 28 of the first array block 20 are respectively connected to the drains of the switch transistors Q1b, Q2b, Q3b, Q4b and the switch transistors Q5b, Q6b, Q7b, Q8b. The sources of the switch transistors Q1b, Q2b, Q3b, Q4b and the switch transistors Q5b, Q6b, Q7b, Q8b to the source lines 71 and 74.

The encoded address signal 32 is decoded by the address decoder 30 to produce the decoded address signal 34 that is the input to the word line amplifier 40, the read/write control circuit 50, and the bit line amplifier 60 to select the desired memory cells M11, ..., MN4, and M21, ..., MM4 for either reading or writing. The word line amplifier 40 selects the word line 41, 42, 43, and 44 containing the desired memory cells M1, ..., MN4, and M21, ..., MM4. The bit line amplifier 60 conditions the global bit lines 61, 62, 63, and 64 to contain the bit line signals to read or write (program/erase) the desired memory cells M11, ..., MN4, and M21, MM4. The gate select lines 51 and 52 are selectively activated to connect the connect the local bit lines 11, 12, 13, and 14 for the array block 10 or the local bit lines 21, 22, 23, and 24 for array block 20 to the global bit lines 61, 62, 63, and 64. The gate select lines 58 and 59 are selectively activated to connect the local bit lines 15, 16, 17, and 18 for the array block 10 or the local bit lines 25, 26, 27, and 28 for array block 20 to the source lines 71 and 74.

The structure as shown will allow only one array block 10 or 20 to be selected. Since all the local bit lines 15, 16, 17, and 18 for the array block 10 or the local bit lines 25, 26, 27, and 28 for array block 20 are connected through the switch transistors Q1b, Q2b, Q3b, Q4b and the switch transistors Q5b, Q6b, Q7b, Q8b to the source lines 71 and 74, only one of the cells of the selected array block is read from or programmed.

As is known, the entire block may be erased simultaneously.

The AND array, as described, is not suitable for the simultaneous read and write operation because of the array structure. When the first array block 10 is selected, the switch transistors Q1b, Q2b, Q3b, Q4b are all turned on by the control signal present on the gate select line 51, and all the local bit lines 11, 12, 13, and 14 for the array block 10 are connected to the global bit lines 61, 62, 63, and 64. The local bit lines 21, 22, 23, and 24 for array block 20 will not be able to read from or written to through the global bit lines 61, 62, 63, and 64 because all global bit lines 61, 62, 63, and 64 are already connected to the local bit lines 11, 12, 13, and 14 for the array block 10.

U.S. Pat. No. 5,847,998 (Van Buskirk) discloses a NOR-array structured flash memory capable of performing simultaneous read and write operations. The global bit lines are separated into two groups, 'read bit lines' and 'write bit lines'. Through the appropriate selection of switch transistors, local bit lines that are selected for read are connected to the global read bit lines, and the local lines that are selected for write are connected to the global write bit lines. Meanwhile, all the deselected local lines remain disconnected to be floating. However, this approach can be only applied to the NOR-like array only and is not applicable to AND-like array, because of differences in the cell operations, bias conditions, and sector organization of the NOR-like array versus the AND-like array.

To contrast the write operations of the NOR-like array and the AND-like array, the deselected local bit lines of the NOR-like array are disconnected to be floating. The NOR-like array uses channel-hot-electron (CHE) injection in programming, which requires a relatively large current, e.g. 500 uA, flowing through the memory cell channel. When deselected local bit lines are floating, the channel current is interrupted and automatically prevents the cells being programmed. Conversely, the AND-like array uses Fowler-Nordheim (FN) tunneling in programming. For this mechanism, when programming, a high electric field is applied across the tunnel oxide layer underneath the floating gate, so the high field will cause the electron to tunnel through the thin tunnel oxide. To inhibit the tunneling, the deselected bit lines have an appropriate middle-high voltage in order to cancel the electric field. Therefore, for AND-like array, during the write operation, both the selected and deselected bit lines have different voltages applied to the local bit lines. If there is no biasing voltage to cancel the electric field, the deselected local bit lines will be disturbed and cause the data loss from the deselected local bit lines. More detailed descriptions of the operations and program conditions for the NOR array and the AND array, are illustrated by U.S. Pat. No. 5,126,808 (Montalvo et al.) and U.S. Pat. No. 6,072,722 (Hirano) respectively. The problem of program-disturb associated with the AND-like array is discussed in more detail in U.S. Pat. No. 6,009,016 (Ishii et al.).

The NOR-like array typically cannot program a large number of the cells at one time because of the relatively high current required during programming. Thus, typically flash memories are programmed one byte at one time. In contrast, the AND-like array uses Fowler-Nordheim programming, which requires low programming current that is typically approximately 10 pA per cell. Thus, the AND-like array typically is able to program one page (e.g. 128*b* to 1024*b*) at one time.

Van Buskirk, as structured, is not applicable to the AND-like array because, as discussed above, the AND-like array requires the deselected local bit lines to be biased to prevent the disturb of the programmed digital data. Further, Van Buskirk cannot allow simultaneous writing of multiple array blocks because of the large current requirements.

U.S. Pat. No. 5,748,538 (to Lee et al. and assigned to the same assignee as the present invention) discloses a flash memory array referred to as an OR array, which according to the definition is included in the AND-like array category. The fundamental structure of the array is as shown in FIG. 2 except for the organization of the switching transistors that selectively connect the memory cells M11, . . . , MN4, and M21, . . . , MM4 to the global bit lines 61, 62, 63, 64 and 65. The first set of local bit lines 11, 12, 13, and 14 for array block 10 are connected respectively to the sources of the switch transistors Q1*a*, Q2*a*, Q3*a*, and Q4*a*. The drain of the switch transistors Q1*a* is connected to the global bit line 61. The drains of the switch transistors Q2*a* and Q3*a* are connected to the global bit line 63. The drain of the switch transistor Q4*a* is connected to the global bit lines 65. The local bit lines 21, 22, 23, and 24 for array block 20 are connected respectively to the sources of the switch transistors Q5*a*, Q6*a* Q7*a*, and Q8*a*. The drain of the switch transistors Q5*a* is connected to the global bit line 61. The drains of the switch transistors Q6*a* and Q6*a* are connected to the global bit line 63. The drain of the switch transistor Q7*a* is connected to the global bit lines 65. The second set of local bit lines 15, 16, 17, and 18 for array block 10 are connected respectively to the drains of the switch transistors Q1*b*, Q2*b*, Q3*b*, and Q4*b*. The sources of the switch transistors Q1*b* and Q2*b* are connected to the global bit line 62. The sources of the switch transistor Q3*b* and Q4*b* is connected to the global bit line 64. The local bit lines 21, 22, 23, and 24 for array block 20 are connected respectively to the drains of the switch transistors Q5*b*, Q6*b*, Q7*b*, and Q8*b*. The sources of the switch transistors Q5*b* and Q6*b* are connected to the global bit line 62. The sources of the switch transistor Q7*b* and Q8*b* is connected to the global bit line 64.

The global bit lines 61, 62, 63, 64 and 65 are connected to the bit line amplifier 60 and the sense amplifier 70. The bit line amplifier 60 conditions the bit lines to perform the appropriate read or write (program/erase) operation to the desired memory cells M11, . . . , MN4, and M21, . . . , MM4. The memory cells M11, . . . , MN4, and M21, . . . , MM4 when appropriately connected to through the switch transistors Q1*a*, Q2*a*, Q3*a*, and Q4*a*; Q5*a*, Q6*a*, Q7*a*, and Q8*a*; Q1*b*, Q2*b*, Q3*b*, and Q4*b*; and Q5*b*, Q6*b*, Q7*b*, and Q8*b* to the global bit lines 61, 62, 63, 64 and 65 are able to transfer the digital data to the sense amplifier 70. The digital data is then reconstructed in the sense amplifier 70 and transferred to the data output bus 76.

The gate control line 51*a* is connected to the gates of the switch transistors Q1*a* and Q3*a*. The gate control line 58*a* is connected to the gates of the switch transistors Q2*a* and Q4*a*. The gate control line 51*b* is connected to the gates of the switch transistors Q1*b* and Q3*b*. The gate control line 58*b* is connected to the gates of the switch transistors Q2*b* and Q4*b*. The gate control line 52*a* is connected to the gates of the switch transistors Q5*a* and Q7*a*. The gate control line 59*a* is connected to the gates of the switch transistors Q6*a* and Q8*a*. The gate control line 52*b* is connected to the gates of the switch transistors Q5*b* and Q7*b*. The gate control line 59*b* is connected to the gates of the switch transistors Q6*b* and Q8*b*.

The local bit lines 11, 12, 13, and 14 for array block 10 and the local bit lines 21, 22, 23, and 24 for array block 20 are designated as two groups—an even group and odd group. During the read or write operation, only one group of the local bit lines will be accessed at any one time. For example, the local bit lines 11, 12, 13, and 14 for array block 10 are separated into the even local bit lines 12 and 14 and the odd local bit lines 11 and 13. In a read operation, the odd local bit lines 11 and 13 are connected to the global bit lines 61 and 63, when the select transistors Q1*a* and Q3*a* are turned on by the control signal 51*a*. Meanwhile, the select transistors Q2*a* and Q4*a* for the even local bit lines 12 and 14 are turned off by the control signal 61*a* to disconnect the even local bit lines 12 and 14 from the odd global bit lines 63 and 65. In the read operation, the even global bit lines 62 and 64 are biased by the sense amplifier 70 to act as virtual ground for the selected cells. Thus, the even global bit lines 62 and 64 are connected to the source lines of the odd local bit lines 15 and 17 by turning on the select transistors Q1*b* and Q3*b*. Meanwhile, the select transistors Q2*b* and Q4*b* for the even local bit lines 16 and 18 are turned off to disconnect the source lines of the even local bit lines 16 and 18 from the even global bit lines 62 and 64. The activation of the switch transistors as described enables the odd local bit lines 11 and 13 to be read while remaining the even local bit lines 12 and 14 remain disconnected to be floating. The even global bit lines 62 and 64 are similarly read while the odd local bit lines 11 and 13 are disconnected by appropriately activating the switching transistors Q1*a*, Q2*a*, Q3*a* and Q1*b*, Q2*b*, Q3*b*, and Q4*b*. As can be seen, the array block 20 is not addressable during any operation within the array block 10. Thus is becomes obvious that there can be not simultaneous reading and/or writing to the multiple array blocks 10 or 20.

SUMMARY OF THE INVENTION

An objective of this invention is to provide a integrated circuit memory capable of simultaneous reading and/or writing of digital data to multiple memory cells within the integrated circuit memory.

Another object is to provide a non-volatile integrated circuit memory capable of simultaneous reading and/or writing of digital data to multiple memory cells within the integrated circuit memory.

Further another object of this invention is to provide a non-volatile integrated circuit memory having an AND-like array structure capable of simultaneous reading and writing of digital data to multiple memory cells within the integrated circuit memory.

To accomplish at least one of these and other objects, a integrated circuit memory array that allows simultaneous storage and retrieval of digital data includes a plurality of array blocks of memory cells. The memory cells within an array block of memory cells are arranged in columns and rows. A plurality of block bit lines is in communication with each array block of memory cells such that each block bit line interconnects the memory cells of one column of memory cells within one array block. A plurality of word lines is in communication with each array block of memory cells such that each word line interconnects the memory cells of one row within one array block.

The integrated circuit memory further includes a plurality of global bit lines in communication with the array blocks to select a column of the array blocks and to transfer the digital data from and to the array blocks. A bit line selector is connected between the plurality of global bit lines and the plurality of block bit lines to selectively connect the plurality of global bit lines to the block bit lines. An array controller is connected to the plurality of word lines, the plurality of bit lines and the bit line selector to control selection of a row of a block of the array, control transfer of the digital data from selected global bit lines to selected block bit lines, control transfer of the digital data to other selected global bit lines from other selected bit lines to allow simultaneous transfer of the digital data from and to selected memory cells.

The integrated circuit memory array further has sense amplifiers connected to each of the global bit lines to reconstruct the stored digital data. Each global bit line is divided into two portions. The first portion is connected to the array controller to provide select signals to selectively activate one column of the memory array. The second portion is connected to the sense amplifier to transfer retained digital data to a selected sense amplifier.

The bit line selector consists of a first plurality of switches and a second plurality of switches. Each switch of the first plurality of switches has a first terminal connected to one of the plurality of global bit lines, a second terminal connected to one of the block bit lines, and a control terminal connected to receive control signals from the array controller. Each switch of the second plurality of switches has a first terminal connected to a second end of one of the block bit lines, a second terminal connected to the second portion of one of the plurality of global bit lines, and a control terminal connected to receive control signals from the array controller. Each switch is a MOS transistor with the first terminal being a drain of the MOS transistor, the second terminal being a source of the MOS transistor and the control terminal being a gate of the MOS transistor.

BRIEF DESCRIPTION OF THE DRAWINS

DETAILED DESCRIPTION OF THE INVENTION

The simultaneous read and/or write AND-like flash memory of this invention, in the preferred embodiment, has an AND array structure as described in FIG. 2. A bit line selector is connected between the global bit lines and the local bit lines, and between the source lines and the local bit lines. The global bit lines are selectively connected to the local bit lines in even and odd sets such that one set of global bit lines is connected to the local bit lines of one array block, while the other set is connected to the local bit lines of a second array block. The source lines are then selectively connected to the local bit lines to allow reading of selected bits of the array block. This structure allows simultaneous read and/or writing of multiple array blocks.

Figure 4:
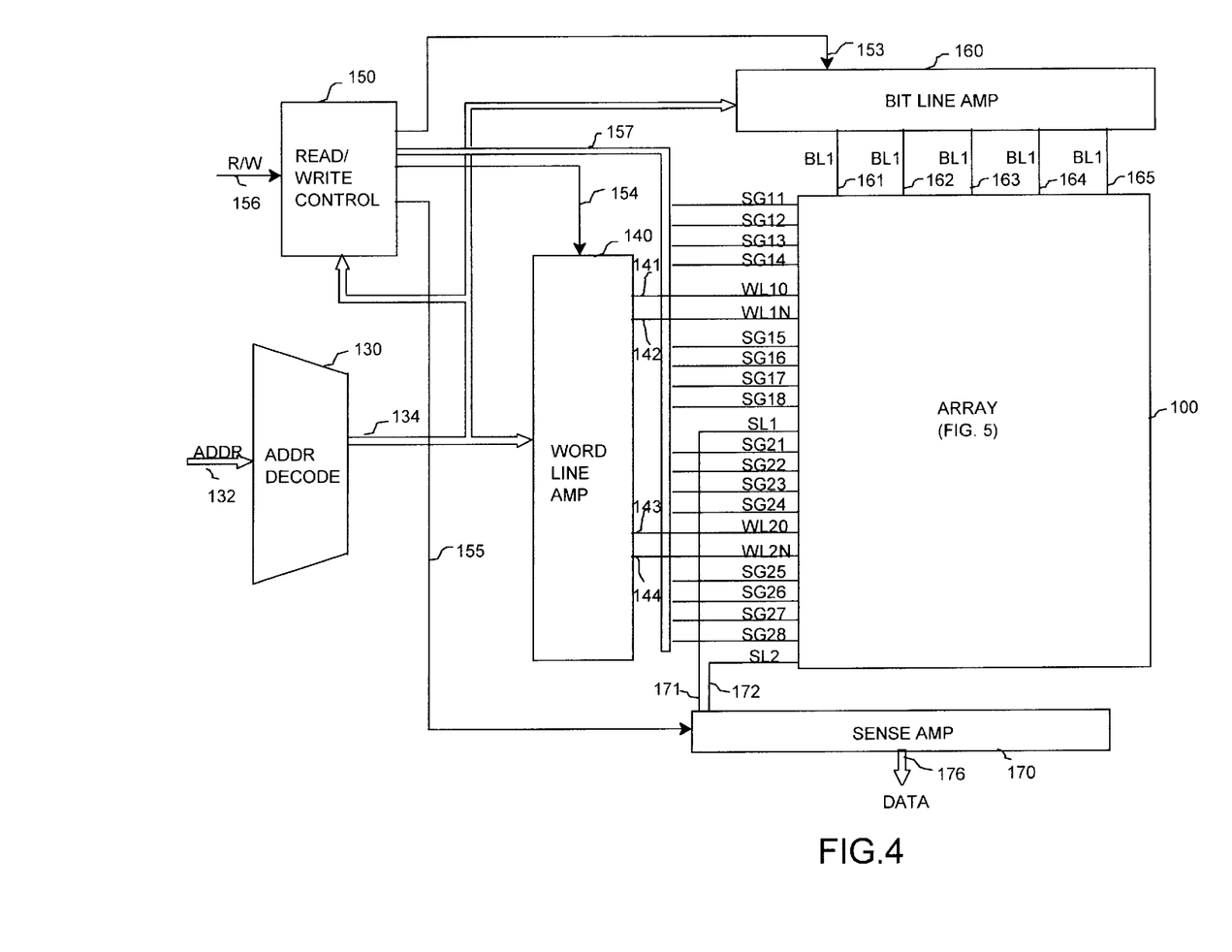
FIG. 4 is a schematic diagram of a simultaneous read and/or write AND-like flash memory array of this invention.
Figure 5:
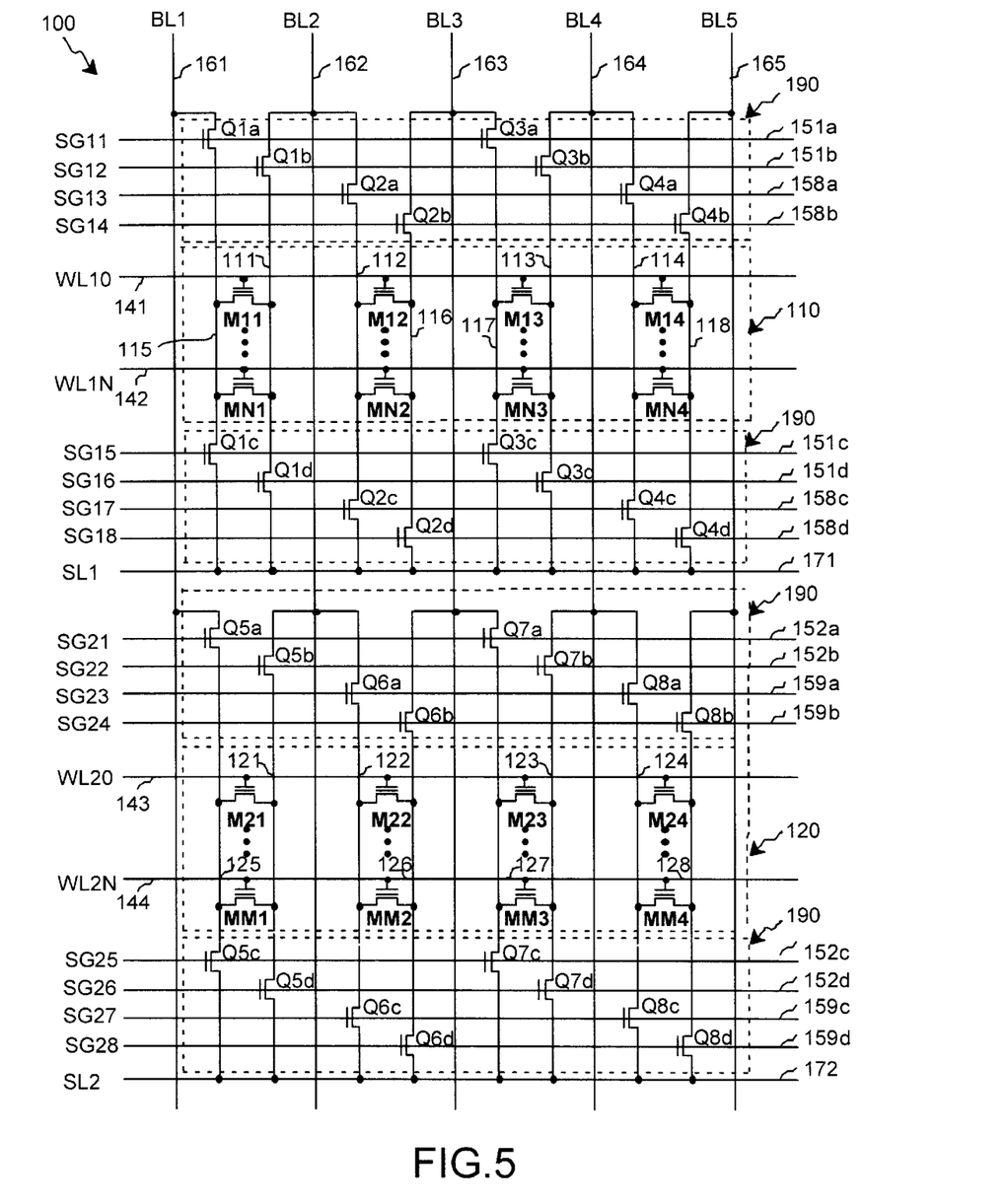
FIG. 5 is schematic diagram of the flash memory array structure of the AND-like flash memory array of this invention of FIG. 4.

Refer now to FIGS. 4 and 5 for a discussion of the structure and function of the simultaneous read and/or write flash memory of this invention. The input encoded address signal 132 is applied to the address decoder 130. The encoded address signal 132 is decoded to form the appropriate memory cell selection and conditioning signals 134, which are applied to the word line amplifier 140, the bit line amplifier 160, and the read/write control circuit 150.

The word line amplifier 140 is connected to the flash memory array 100 by the word lines 141, 142, 143, and 144 to transfer the word line conditioning signals to the flash memory array. The bit line amplifier 160 is connected to the flash memory array 100 by the global bit lines 161, 162, 163, 164 and 165 to transfer the bit line conditioning signals to the flash memory array 100.

The read/write control signal 156 and other timing and control signals (not shown) are applied to the read/write control circuit 150. The read/write control circuit 150 generates control and timing signals that are applied to the control lines 153, 154, 155. The control lines 153, 154, 155 are respectively connected to the bit line amplifier 160, the word line amplifier 140, and the sense amplifier 170. The bit line amplifier 160, the word line amplifier 140, and the sense amplifier 170 then create their appropriate conditioning signals to simultaneously read and/or write multiple selected memory cells of the flash memory array 100.

The sense amplifier 170 is connected to the flash memory array 100 by the source lines 171 and 172 to receive the digital data stored within the desired selected memory cells of the flash memory array 100. The sense amplifier 170 reconstructs the digital data and transfers it to the data output bus 176 for transfer to external circuitry.

The read/write control circuit 150 is connected to the flash memory array 100 by the gate signal lines 157. The read/write control circuit 150 generates the appropriate activation signals to connect the global bit lines 161, 162, 163, 164 and 165 to the columns of the memory array blocks of the flash memory array 100 that contain the desired memory cells to be read and/or written. Further, the read/write control circuit 150 generates the appropriate activation signals to connect the columns of the memory array blocks of the flash memory array 100 to the source lines 171 and 172 to capture the stored digital data of the desired memory cells to be read.

Refer now to FIG. 5 for a more detailed description of the flash memory array 100 of this invention. The flash memory cells M11, MN4, and M21, . . . , MM4 are arranged in rows and columns and groups of the flash memory cells M11, . . . , MN4, and M21, . . . , MM4 are divided into blocks 110 and 120. The control gates of the memory cells M11, . . . , MN4, and M21, . . . , MM4 of each row of the flash memory cells M11, . . . , MN4, and M21, . . . , MM4 are connected together and to the word line amplifier 140 by the word lines 141, 142, 143, and 144. The drains of the memory cells M11, . . . , MN4, and M21, . . . , MM4 of each column within each array block 110 and 120 of the flash memory cells M11, . . . , MN4, and M21, MM4 are connected together with the local bit lines 111, 112, 113,and 114; and 121, 122, 123, and 124. The sources of the memory cells M11, . . . , MN4, and M21, . . . , MM4 of each column within each array block 110 and 120 of the flash memory cells M11, . . . , MN4, and M21, . . . , MM4 are connected together with the local bit lines 115, 116, 117, and 118; and 125, 126, 127, 128. As is fundamental to the art, the sources and drains field effect transistors of the flash memory cells M11, . . . , MN4, and M21, . . . , MM4 are essentially interchangeable and are capable of conducting current from the designated source to the designated drain as well as the conventional designated drain to the designated source. Thus by appropriately connecting the local bit lines 111, 112, 113, and 114; 115, 116, 117, and 118; 121, 122, 123, and 124; and 125, 126, 127, 128 to the global bit lines 161, 162, 163, 164 and 165 and the source lines 171 and 172, the flash memory cells M11, ..., MN4, and M21, ..., MM4 of separate array blocks 110 and 120 are able to be simultaneously read from and/or written to.

Each of the local bit lines 111, 112, 113, and 114; 115, 116, 117, and 118; 121, 122, 123, and 124; and 125, 126, 127; each of the global bit lines 161, 162, 163, 164 and 165; and each of the source lines 171 and 172 are connected to the bit line selector 190. The bit line selector 190 is composed of switch transistors Q1a, ..., Q1d, ..., Q8a, ..., Q8d, which selectively connect the local bit lines 111, 112, 113, and 114; 115, 116, 117, and 118; 121, 122, 123, and 124; and 125, 126, 127 to the global bit lines 161, 162, 163, 164 and 165 and the source lines 171 and 172. The structure as shown allows each column of the each array block 110 and 120 to be selectively connected to either an "odd" global bit line 161, 163, or 165 or and "even" global bit line 162 or 164. The connections are dependent on the gate select signals applied to the gate select lines 151a, ..., 151d; 152a, ..., 152d; 158a, ..., 158d; and 159a, ..., 150d.

Refer to Table 1 for the details of the signals of the gate select lines 151a, ..., 151d; 152a, ..., 152d; 158a, ..., 158d; and 159a, ..., 150d to activate the switch transistors Q1a, ..., Q1d, ..., Q8a, ..., Q8d.

accomplish the simultaneous read and/or write operations to the separate array blocks 110 and 120.

The first example of the operation of the flash memory illustrates a reading of digital data simultaneously from two separate array blocks 110 and 120. In this example, the memory cell M11 of the first array block 110 and the memory cell M22 of the array block 120 are the cells being selected for reading. The bit line amplifier 160 conditions the bit line 161 and the bit line 162 to provide the necessary biasing voltage for reading the memory cells M11 and M22. The word line amplifier 140 conditions the word lines 141 and 143 to provide the necessary biasing voltage for reading the memory cells of the row of the array blocks 110 and 120. The non-selected bit lines 163, 164, and 165 and the non-selected word lines 142 and 144 are conditioned to the necessary voltages to minimize cell disturbances during the read operations. The read/write control circuit 150 activates the gate select lines 151a to turn on the switch transistor Q1a to connected the local bit line 115 to the global bit line 161 to allow reading of the memory cells on the column containing the desired memory cell M111. At this same time, the read/write control circuit 150 activates the gate select line 151d to turn-on the switch transistor Q1d to connect the local bit line 111 to the source line 171. The source line 171 is set to a virtual ground through the sense amplifier 170, which will sense and reconstruct the digital data stored in the memory cell M11.

TABLE 1

| Local Bit Line | 111 | 115 | 112 | 116 | 113 | 117 | 114 | 118 |
|---|---|---|---|---|---|---|---|---|
| Gate Signal Line Active | | | | | | | | |
| SG11 151a | BL1 161 | | | | BL3 161 | | | |
| SG12 151b | | BL2 162 | | | | BL4 164 | | |
| SG13 158a | | | BL2 162 | | | | BL4 164 | |
| SG14 158b | | | | | BL3 163 | | | BL5 165 |
| | | | | Global Bit Line Connected to | | | | |
| SG15 151c | SL1 171 | | | | SL1 171 | | | |
| SG16 151d | | SL1 171 | | | | SL1 171 | | |
| SG17 158c | | | SL1 171 | | | | SL1 171 | |
| SG19 158c | | | | | SL1 171 | | | SL1 171 |
| | | | | Source line Connected to | | | | |
| Local Bit Line | 121 | 125 | 122 | 126 | 123 | 127 | 124 | 128 |
| Gate Signal Line Active | | | | | | | | |
| SG21 152a | BL1 161 | | | | BL3 161 | | | |
| SG22 152b | | BL2 162 | | | | BL4 164 | | |
| SG23 159a | | | BL2 162 | | | | BL4 164 | |
| SG24 159b | | | | | BL3 163 | | | BL5 165 |
| | | | | Global Bit Line Connected to | | | | |
| SG25 152c | SL2 172 | | | | SL2 172 | | | |
| SG26 152d | | SL2 172 | | | | SL2 172 | | |
| SG27 159c | | | SL2 172 | | | | SL2 172 | |
| SG29 159d | | | | | SL2 172 | | | SL2 172 |
| | | | | Source line Connected to | | | | |

The connections as shown in Table 1 allows one array block 110 to be read from and/or written to and at the same time the second array block 120 to simultaneously be read from and/or written to. The following examples will demonstrate the various combinations of states for the gate select signals applied to the gate select lines 151a, ..., 151d; 152a, ..., 152d; 158a, ..., 158d; and 159a, ..., 150d to activate the switch transistors Q1a, ..., Q1d, ..., Q8a, ..., Q8d to The gate select lines 151a and 151d, as described, also turn-on the switch transistors Q3a and Q3d. This would simultaneously select the memory cell M13 for simultaneous reading. However, the bit line amplifier 160 conditions the bit line 163 to a voltage to prevent any interference of the digital data from the memory cell M13 from impacting the reconstruction of the digital data from the memory cell M111.

To perform the simultaneous reading of the memory cell M22, the read/write control circuit 150 activates the gate select line 159a to turn on the switch transistor Q6a to connected the local bit line 122 to the global bit line 162 to allow reading of the memory cells on the column containing the desired memory cell M22. At this same time, the read/write control circuit 150 activates the gate select line 159d to turn-on the switch transistor Q6d to connect the local bit line 126 to the source line 172. The source line 172 is set to a virtual ground through the sense amplifier 170, which will sense and reconstruct the digital data stored in the memory cell M22.

The gate select lines 159a and 159d, as described, also turn-on the switch transistors Q8a and Q8d. This would simultaneously select the memory cell M24 for simultaneous reading. However, the bit line amplifier 160 conditions the bit line 164 to a voltage to prevent any interference of the digital data from the memory cell M24 from impacting the reconstruction of the digital data from the memory cell M22.

Alternately, the bit line amplifier 160 conditions the bit line 162 and the bit line 163 to provide the necessary biasing voltage for reading the memory cells M1 and M22. The word line amplifier 140 conditions the word lines 141 and 143 to provide the necessary biasing voltage for reading the memory cells of the row of the array blocks 110 and 120. The non-selected bit lines 163, 164, and 165 and the non-selected word lines 142 and 144 are conditioned to the necessary voltages to minimize cell disturbances during the read operations. The read/write control circuit 150 activates the gate select lines 151b to turn on the switch transistor Q1b to connected the local bit line 111 to the global bit line 162 to allow reading of the memory cells on the column containing the desired memory cell M11. At this same time, the read/write control circuit 150 activates the gate select line 151c to turn-on the switch transistor Q1c to connect the local bit line 115 to the source line 171. The source line 171 is set to a virtual ground through the sense amplifier 170, which will sense and reconstruct the digital data stored in the memory cell M11.

The gate select lines 151b and 151c, as described, also turn-on the switch transistors Q3b and Q3c. This would simultaneously select the memory cell M13 for simultaneous reading. However, the bit line amplifier 160 conditions the bit line 164 to a voltage to prevent any interference of the digital data from the memory cell M13 from impacting the reconstruction of the digital data from the memory cell M11.

To perform the simultaneous reading of the memory cell M22, the read/write control circuit 150 activates the gate select lines 159b to turn on the switch transistor Q6b to connect the local bit line 126 to the global bit line 163 to allow reading of the memory cells on the column containing the desired memory cell M22. At this same time, the read/write control circuit 150 activates the gate select line 159c to turn-on the switch transistor Q6c to connect the local bit line 122 to the source line 172. The source line 172 is set to a virtual ground through the sense amplifier 170, which will sense and reconstruct the digital data stored in the memory cell M22.

The gate select lines 159b and 152c, as described, also turn-on the switch transistors Q8b and Q8c. This would simultaneously select the memory cell M24 for simultaneous reading. However, the bit line amplifier 160 conditions the bit line 165 to a voltage to prevent any interference of the digital data from the memory cell M24 from impacting the reconstruction of the digital data from the memory cell M22.

As can be seen, the connecting of a column containing a desired memory cells to a global bit line, either odd or even in this embodiment, allows a column of another desired memory cell to be connected to a non used global bit line for simultaneous reading of multiple array blocks.

The second example of the operation of the flash memory illustrates a reading and writing (programming/erase) of digital data simultaneously from two separate array blocks 110 and 120. In this example, the memory cell M11 of the first array block 110 is selected for writing to and the memory cell M22 of the array block 120 is selected for reading from. The bit line amplifier 160 conditions the bit line 161 with the voltage necessary (+4–5V) for writing to the desired memory cell M11. The bit line amplifier 160 conditions bit line 162 to provide the necessary biasing voltage for reading the desired memory cell M22. The word line amplifier 140 conditions the word line 141 with the necessary voltage (<−9V) for writing to the desired memory cell M11. The word line amplifier conditions the word line 143 to provide the necessary biasing voltage for reading the desired memory cell M22. The non-selected bit lines 163b, 164, and 165 and the non-selected word lines 142 and 144 are conditioned to the necessary voltages to minimize cell disturbances during the write and read operations. The read/write control circuit 150 activates the gate select lines 151a to turn on the switch transistor Q1a to connected the local bit line 115 to the global bit line 161 to allow programming of the desired memory cell M11. At this same time, the read/write control circuit 150 activates the gate select line 151d to turn-on the switch transistor Q1d to connect the local bit line 111 to the source line The source line 171 is set to a virtual ground through the sense amplifier 170. As is shown in Hirano, erasing the desired memory cell requires floating of the source and drain of the memory cells of the array block 110. Thus, for an erase operation, none of the switch transistors are activated. This forces the source drains of the memory cells M11, . . . , MN4 of the array block 110 to float during the erase operation.

The gate select lines 151a and 151d, as described, also turn-on the switch transistors Q3a and Q3d. This would simultaneously select the memory cell M13 for simultaneous programming. However, the bit line amplifier 160 conditions the bit line 163 to a voltage to prevent any interference of the digital data from the memory cell M13 from being impacted during the programming of the digital data to the memory cell M11. As described above, an erase operation is for a full array block and thus involves all memory cells M11, . . . , MN4 of the array block 110.

To perform the simultaneous reading of the memory cell M22, the read/write control circuit 150 activates the gate select lines 159a to turn on the switch transistor Q6a to connect the local bit line 122 to the global bit line 162 to allow reading of the memory cells on the column containing the desired memory cell M22. At this same time, the read/write control circuit 150 activates the gate select line 159d to turn-on the switch transistor Q6d to connect the local bit line 126 to the source line 172. The source line 172 is set to a virtual ground through the sense amplifier 170, which will sense and reconstruct the digital data stored in the memory cell M22.

The gate select lines 159a and 159d, as described, also turn-on the switch transistors Q8a and Q8d. This would simultaneously select the memory cell M24 for simultaneous reading. However, the bit line amplifier 160 conditions the bit line 164 to a voltage to prevent any interference of the digital data from the memory cell M24 from impacting the reconstruction of the digital data from the memory cell M22.

Alternately, the bit line amplifier 160 conditions the bit line 162 to provide the necessary biasing voltage for writing (program/erase) the memory cell M11. The bit line amplifier 160 then conditions the bit line 163 to provide the necessary biasing voltage for reading the memory cell M22. The word line amplifier 140 conditions the word lines 141 and 143 to provide the necessary biasing voltage for writing the memory cell M11 and for reading the memory cell M22. The non-selected bit lines 161, 164, and 165 and the non-selected word lines 142 and 144 are conditioned to the necessary voltages to minimize cell disturbances during the read operations. The read/write control circuit 150 activates the gate select lines 151b to turn on the switch transistor Q1b to connected the local bit line 111 to the global bit line 162 to allow programming of the desired memory cell M11. At this same time, the read/write control circuit 150 activates the gate select line 151c to turn-on the switch transistor Q1c to connect the local bit line 115 to the source line 171. The source line 171 is set to a virtual ground through the sense amplifier 170.

The gate select lines 151b and 151c, as described, also turn-on the switch transistors Q3b and Q3c. This would simultaneously select the memory cell M13 for simultaneous programming. However, the bit line amplifier 160 conditions the bit line 164 to a voltage to prevent any disturbance of the digital data present on the memory cell M13 during programming of the digital data from the memory cell M11. As described above, the erase operation is a block operation, erasing all the digital data present on the array block 110.

To perform the simultaneous reading of the memory cell M22, the read/write control circuit 150 activates the gate select lines 159b to turn on the switch transistor Q6b to connect the local bit line 126 to the global bit line 163 to allow reading of the memory cells on the column containing the desired memory cell M22. At this same time, the read/write control circuit 150 activates the gate select line 159c to turn-on the switch transistor Q6c to connect the local bit line 122 to the source line 172. The source line 172 is set to a virtual ground through the sense amplifier 170, which will sense and reconstruct the digital data stored in the memory cell M22.

The gate select lines 159b and 152c, as described, also turn-on the switch transistors Q8b and Q8c. This would simultaneously select the memory cell M24 for simultaneous reading. However, the bit line amplifier conditions the bit line 165 to a voltage to prevent any interference of the digital data from the memory cell M24 from impacting the reconstruction of the digital data from the memory cell M22.

As can be seen, the connecting of a column containing a desired memory cells to a global bit line, either odd or even in this embodiment, allows a column of another desired memory cell to be connected to a non used global bit line for simultaneous writing and/or reading of multiple array blocks.

The example as described performed a write operation to the memory cells M11, . . . , MN4 of the array block 110 and a read operation to memory cells M21, . . . , MM4 of the array block 120. It can similarly be shown that the read operation could have be from the memory cells M11, . . . , MN4 of the array block 110 and write operation could have been to the memory cells M21, . . . , MM4 of the array block 120.

The third example of the operation of the flash memory illustrates a writing (programming/erasing) of digital data simultaneously to two separate array blocks 110 and 120. In this example, the memory cell M11 of the first array block 110 and the memory cell M22 of the array block 120 are the cells being selected for programming. The simultaneous erasing of multiple blocks of the flash memory is accomplished by applying the appropriate voltage to the word lines 141, 142, 143, and 144 to cause the Fowler-Nordheim tunneling in the desired array blocks. However, for programming, The word lines 141 and 144 containing the desired memory cells M11 and M22 must be set to a relatively large negative voltage level (<−9V) and the global bit line 161 and 162 is set to a moderately high voltage (4–5 V) and the source lines 171 and 172 are set to approximately the ground reference level. This voltage configuration allows the Fowler-Nordheim tunneling to program the desired cells M11 and M22.

The read/write control circuit 150 activates the bit line selector 190 to connect the global bit line 161 to the local bit line 115 and to connect the global bit line 162 to the local bit line 122. To accomplish this, the read/write control circuit 150 activates the gate select line 151a to turn on the transistor Q1a, which connects the global bit line 161 to the local bit line 115. The read/write control circuit 150 activates the gate select line 151d to turn-on the transistor Q1d to connect the local bit line 111 to the source line 171. In a similar fashion the read/write control circuit 150 activates the gate select lines 159a and 159d to respectively turn on the transistors Q6a and Q6d to connected the global bit line 162 to the local bit line 122 and the source line 172 to the local bit line 126. This configuration, as described, programs the desired memory cells M1 and M22. It is can be readily shown that by conditioning the global bit lines 162 and 163 to the appropriate voltage levels and appropriately selecting the suitable switching transistors, the desired memory cells M11 and M22 can be alternately programmed.

The example as shown has illustrated the simultaneous reading from and/or writing to flash memory array cells in separate memory blocks. The structure as shown is particularly suitable for an AND type flash structure, but it not restrained to this particular structure and may be applied to other integrated circuit memory structures —either volatile or non-volatile. Further, the structure as shown is expandable to allow simultaneous reading from and/or writing to any number of desired memory cells in any number of array blocks. Though the preferred embodiment employs use of even and odd global bit lines for applying the necessary biasing voltages for reading and/or writing, other structures would allow any suitable number of sets of global bit lines for reading and/or writing a number of desired cells within multiple array blocks.

While this invention has been particularly shown and described with reference to the preferred embodiments thereof, it will be understood by those skilled in the art that various changes in form and details may be made without departing from the spirit and scope of the invention.

The invention claimed is:

1. A integrated circuit memory array that allows simultaneous storage and retrieval of digital data comprising:
   a plurality of array blocks of memory cells, wherein the memory cells of each block are arranged in columns and rows;
   a plurality of block bit lines in communication with each array block of memory cells such that each block bit line interconnects the memory cells of one column of memory cells within one array block;

a plurality of word lines in communication with each array block of memory cells such that each word line interconnects the memory cells of one row within one array block;

a plurality of global bit lines connected to the array blocks to select a column of the array blocks and to transfer the digital data from and to the array blocks;

a bit line selector connected between the plurality of global bit lines and the plurality of block bit lines to selectively connect the plurality of global bit lines to the block bit lines; and an array controller connected to the plurality of word lines, the plurality of bit lines and the bit line selector to control selection of a row of a block of the array, control transfer of the digital data from selected global bit lines to selected block bit lines, control transfer of the digital data to other selected global bit lines from other selected bit lines to allow simultaneous transfer of the digital data from and to selected memory cells.

2. The memory array of claim 1 wherein sense amplifiers are connected to each of the global bit lines to reconstruct the stored digital data.

3. The memory array of claim 2 wherein each global bit line has a first portion connected to the array controller to provide select signals to selectively activate one column of the memory array and a second portion connected to the sense amplifier to transfer retained digital data to a selected sense amplifier.

4. The memory array of claim 3 wherein the bit line selector comprises:

a first plurality of switches wherein each switch of the first plurality of switches has a first terminal connected to the first portion of one of the plurality of global bit lines, a second terminal connected to a first end of one of the block bit lines, and a control terminal connected to receive control signals from the array controller; and a second plurality of switches, wherein each switch of the second plurality of switches has a first terminal connected to a second end of one of the block bit lines, a second terminal connected to the second portion of one of the plurality of global bit lines, and a control terminal connected to receive control signals from the array controller.

5. The memory array of claim 4 wherein each switch is a MOS transistor with the first terminal being a drain of said MOS transistor, the second terminal being a source of said MOS transistor and the control terminal being a gate of said MOS transistor.

6. The memory array of claim 1 wherein the memory cells are volatile and non-volatile memory cells.

7. The memory array of claim 6 wherein the non-volatile memory cells are organized as an AND-type flash memory array.

8. The memory array of claim 1 wherein the bit line selector comprises a plurality of switches, each switch having a first terminal connected to one of the plurality of global bit lines, a second terminal connected to one of the block bit lines, and a control terminal connected to receive control signals from the array controller.

9. The memory array of claim 8 wherein each switch is a MOS transistor with the first terminal being a drain of said MOS transistor, the second terminal being a source of said MOS transistor and the control terminal being a gate of said MOS transistor.

10. A bit line control apparatus within a integrated circuit memory array that allows simultaneous storage and retrieval of digital data, said integrated circuit memory array including a plurality of array blocks of memory cells, the memory cells of each block arranged in columns and rows and said bit line control apparatus comprising:

a plurality of block bit lines in communication with each array block of memory cells such that each block bit line interconnects the memory cells of one column of memory cells within one array block;

a plurality of word lines in communication with each array block of memory cells such that each word line interconnects the memory cells of one row within one array block;

a plurality of global bit lines connected to the array blocks to select a column of the array blocks and to transfer the digital data from and to the array blocks;

a bit line selector connected between the plurality of global bit lines and the plurality of block bit lines to selectively connect the plurality of global bit lines to the block bit lines; and an array controller connected to the plurality of word lines, the plurality of bit lines and the bit line selector to control selection of a row of a block of the array, control transfer of the digital data from selected global bit lines to selected block bit lines, control transfer of the digital data to other selected global bit lines from other selected bit lines to allow simultaneous transfer of the digital data from and to selected memory cells.

11. The bit line control apparatus of claim 10 wherein sense amplifiers are connected to each of the global bit lines to reconstruct the stored digital data.

12. The bit line control apparatus of claim 11 wherein each global bit line has a first portion connected to the array controller to provide select signals to selectively activate one column of the memory array and a second portion connected to the sense amplifier to transfer retained digital data to a selected sense amplifier.

13. The bit line control apparatus of claim 12 wherein the bit line selector comprises:

a first plurality of switches wherein each switch of the first plurality of switches has a first terminal connected to the first portion of one of the plurality of global bit lines, a second terminal connected to a first end of one of the block bit lines, and a control terminal connected to receive control signals from the array controller; and a second plurality of switches, wherein each switch of the second plurality of switches has a first terminal connected to a second end of one of the block bit lines, a second terminal connected to the second portion of one of the plurality of global bit lines, and a control terminal connected to receive control signals from the array controller.

14. The bit line control apparatus of claim 13 wherein each switch is a MOS transistor with the first terminal being a drain of said MOS transistor, the second terminal being a source of said MOS transistor and the control terminal being a gate of said MOS transistor.

15. The bit line control apparatus of claim 10 wherein the memory cells are volatile and non-volatile memory cells.

16. The bit line control apparatus of claim 15 wherein the non-volatile memory cells are organized as an AND-type flash memory array.

17. The bit line control apparatus of claim 10 wherein the bit line selector comprises a plurality of switches, each switch having a first terminal connected to one of the plurality of global bit lines, a second terminal connected to one of the block bit lines, and a control terminal connected to receive control signals from the array controller.

18. The bit line control apparatus of claim 17 wherein each switch is a MOS transistor with the first terminal being a drain of said MOS transistor, the second terminal being a source of said MOS transistor and the control terminal being a gate of said MOS transistor.

19. A non-volatile memory device that allows simultaneous programming and retrieval of digital data comprising:
   a plurality of array blocks of memory cells, wherein the memory cells of each block are arranged in columns and rows;
   a plurality of block bit lines in communication with each array block of memory cells such that each block bit line interconnects the memory cells of one column of memory cells within one array block;
   a plurality of word lines in communication with each array block of memory cells such that each word line interconnects the memory cells of one row within one array block;
   a plurality of word lines, wherein each word line interconnects the memory cells of each row;
   a plurality of global bit lines connected to the array blocks to select a column of the array blocks and to transfer the digital data from and to the array blocks;
   a bit line selector connected between the plurality of global bit lines and the plurality of block bit lines to selectively connect the plurality of global bit lines to the block bit lines; and
   an array controller connected to the plurality of word lines, the plurality of bit lines and the bit line selector to control selection of a row of a block of the array, control transfer of the digital data from selected global bit lines to selected block bit lines, control transfer of the digital data to other selected global bit lines from other selected bit lines to allow simultaneous transfer of the digital data from and to selected memory cells.

20. The non-volatile memory device of claim 19 wherein sense amplifiers are connected to each of the global bit lines to reconstruct the stored digital data.

21. The non-volatile memory device of claim 20 wherein each global bit line has a first portion connected to the array controller to provide select signals to selectively activate one column of the non-volatile memory device and a second portion connected to the sense amplifier to transfer retained digital data to a selected sense amplifier.

22. The non-volatile memory device of claim 21 wherein the bit line selector comprises:
   a first plurality of switches wherein each switch of the first plurality of switches has a first terminal connected to the first portion of one of the plurality of global bit lines, a second terminal connected to a first end of one of the block bit lines, and a control terminal connected to receive control signals from the array controller; and
   a second plurality of switches, wherein each switch of the second plurality of switches has a first terminal connected to a second end of one of the block bit lines, a second terminal connected to the second portion of one of the plurality of global bit lines, and
   a control terminal connected to receive control signals from the array controller.

23. The non-volatile memory device of claim 22 wherein each switch is a MOS transistor with the first terminal being a drain of said MOS transistor, the second terminal being a source of said MOS transistor and the control terminal being a gate of said MOS transistor.

24. The non-volatile memory device of claim 19 wherein the non-volatile memory cells are organized as an AND-type flash memory array.

25. The non-volatile memory device of claim 19 wherein the bit line selector comprises a plurality of switches, each switch having a first terminal connected to one of the plurality of global bit lines, a second terminal connected to one of the block bit lines, and a control terminal connected to receive control signals from the array controller.

26. The non-volatile memory device of claim 25 wherein each switch is a MOS transistor with the first terminal being a drain of said MOS transistor, the second terminal being a source of said MOS transistor and the control terminal being a gate of said MOS transistor.

27. A method for simultaneously performing multiple memory operations within a integrated circuit memory array comprising the steps of:
   providing said integrated circuit memory array having a plurality of array blocks of memory cells, the memory cells of each block arranged in columns and rows;
   connecting the memory cells of each column of with a block bit line of a plurality of block bit lines;
   connecting the memory cells of each row of memory cells with a word line of a plurality of word lines;
   providing a plurality of global bit lines connected to the array blocks;
   if a first group of memory cells are to have a first memory operation performed therein, coupling global bit lines that provide signal for the first memory operation to block bit lines of the columns of the array blocks having the first group of memory cells to perform the first memory operation to the first group memory cells; and
   if other groups of memory cells are to have other memory operations performed therein, coupling global bit lines that perform the other memory operations to block bit lines of the columns of the array blocks having the other groups of memory cells to perform the other memory operations to the other groups memory cells;
   wherein said coupling of the global bit lines to the block bit lines occurs simultaneously.

28. The method of claim 27 wherein the memory operations are selected from the group of memory operations consisting of read operations, program operations, write operations, and erase operations.

29. The method of claim 27 wherein the memory cells are volatile and non-volatile memory cells.

30. The method of claim 29 wherein the non-volatile memory cells are organized as an AND-type flash memory array.

31. The method of claim 27 wherein coupling the global bit lines to the block bit lines is performed by a bit line selector; said bit line selector comprising a plurality of switches, each switch having a first terminal connected to one of the plurality of global bit lines, a second terminal connected to one of the block bit lines, and a control terminal connected to receive control signals from the array controller.

32. The method of claim 27 wherein each switch is a MOS transistor with the first terminal being a drain of said MOS transistor, the second terminal being a source of said MOS transistor and the control terminal being a gate of said MOS transistor.

33. The method of claim 27 wherein each global bit line has a first portion connected to an array controller to provide select signals to selectively activate one column of the memory array to perform one of the memory operations and a second portion connected to a sense amplifier to transfer retained digital data to a selected sense amplifier.

34. The method of claim 33 wherein coupling the global bit lines to the block bit lines is performed by a bit line selector; the bit line selector comprising:

a first plurality of switches wherein each switch of the first plurality of switches has a first terminal connected to the first portion of one of the plurality of global bit lines, a second terminal connected to a first end of one of the block bit lines, and a control terminal connected to receive control signals from the array controller; and a second plurality of switches, wherein each switch of the second plurality of switches has a first terminal connected to a second end of one of the block bit lines, a second terminal connected to the second portion of one of the plurality of global bit lines, and a control terminal connected to receive control signals from the array controller.

35. The method of claim 34 wherein each swicth is a MOS transistor with the first terminal being a drain of said MOS transistor, the second terminal being a source of said MOS transistor and the control terminal being a gate of said MOS transistor.

* * * * *

UNITED STATES PATENT AND TRADEMARK OFFICE
CERTIFICATE OF CORRECTION

| | |
|---|---|
| PATENT NO. | : 6,628,563 B1 |
| APPLICATION NO. | : 10/191228 |
| DATED | : September 30, 2003 |
| INVENTOR(S) | : Fu-Chang Hsu, Peter W. Lee and Hsing-Ya Tsao |

It is certified that error appears in the above-identified patent and that said Letters Patent is hereby corrected as shown below:

Title Pg, Item (60) replace Related US Application Data (60) "Provisional application No. 06/303,869, filed on July 9, 2001" with -- Provisional application No. 60/303,869, filed on July 9, 2001. --.

Signed and Sealed this

Seventeenth Day of March, 2009

JOHN DOLL
*Acting Director of the United States Patent and Trademark Office*